(12) United States Patent
Kaplun et al.

(10) Patent No.: US 10,777,429 B2
(45) Date of Patent: Sep. 15, 2020

(54) METHOD OF PRODUCTION OF A STRUCTURE INCLUDING A HIGH THERMAL CONDUCTIVITY SUBSTRATES AND DEVICES ON IT

(71) Applicant: ICDAT LTD. 5, Nesher (IL)

(72) Inventors: Joseph Kaplun, Petach-Tikwa (IL); Adam Hoffman, Haifa (IL)

(73) Assignee: ICDAT LTD., Nesher (IL)

( * ) Notice: Subject to any disclaimer, the term of this patent is extended or adjusted under 35 U.S.C. 154(b) by 0 days.

(21) Appl. No.: 16/162,603

(22) Filed: Oct. 17, 2018

(65) Prior Publication Data

US 2019/0157109 A1  May 23, 2019

Related U.S. Application Data

(60) Provisional application No. 62/576,103, filed on Oct. 24, 2017.

(51) Int. Cl.
| | |
|---|---|
| *H01L 21/50* | (2006.01) |
| *H01L 25/00* | (2006.01) |
| *H01L 23/36* | (2006.01) |
| *H01L 25/11* | (2006.01) |
| *H01L 21/683* | (2006.01) |
| *H01L 29/417* | (2006.01) |
| *H01L 29/66* | (2006.01) |

(52) U.S. Cl.
CPC .......... *H01L 21/50* (2013.01); *H01L 21/6835* (2013.01); *H01L 23/36* (2013.01); *H01L 25/115* (2013.01); *H01L 25/50* (2013.01); *H01L 29/4175* (2013.01); *H01L 29/66462* (2013.01); *H01L 2221/68318* (2013.01); *H01L 2221/68354* (2013.01)

(58) Field of Classification Search
CPC ......... H01L 21/50; H01L 23/36; H01L 25/50; H01L 25/115; H01L 2221/68318; H01L 2221/68354; H01L 21/6835; H01L 29/4175; H01L 29/66462
See application file for complete search history.

(56) References Cited

U.S. PATENT DOCUMENTS

2010/0317132 A1* 12/2010 Rogers ................ H01L 25/0753
438/27

\* cited by examiner

*Primary Examiner* — Kyoung Lee
(74) *Attorney, Agent, or Firm* — Reches Patent (57) ABSTRACT

There may be provided a method for generating a structure, the method may include receiving multiple donor structures that comprise multiple mesas; placing the multiple donor structures on a substrate that lacks a semiconductor layer that covers the entire substrate; and performing a manufacturing process that comprises coupling the multiple mesas to the substrate.

16 Claims, 6 Drawing Sheets

METHOD OF PRODUCTION OF A STRUCTURE INCLUDING A HIGH THERMAL CONDUCTIVITY SUBSTRATES AND DEVICES ON IT

This application claims priority of U.S. provisional patent Ser. No. 62/576,103, filing date Oct. 24, 2018.

BACKGROUND

Various circuits may require substrates that exhibit a high thermal conductivity. Such circuits may include power circuits such as power transistors.

Silicon substrates do not exhibit high thermal conductivity.

Single crystal diamond substrates are very expensive and small—such as having a one-inch diameter.

There is a growing need to provide a circuit that includes semiconductors devices and a substrate that has a high thermal conductivity.

SUMMARY

There may be provided a method for generating a structure, the method may include receiving multiple donor structures that comprise multiple mesas; placing the multiple donor structures on a substrate that lacks a semiconductor layer that covers the entire substrate; and performing a manufacturing process that comprises coupling the multiple mesas to the substrate.

The performing of the manufacturing process may include exposing the multiple mesas.

The performing of the manufacturing process may include removing masking elements from the multiple donor structures.

The performing of the manufacturing process may include electrically coupling the multiple mesas to structural elements.

The performing of the manufacturing process may include electrically coupling at least some of the multiple mesas to each other.

The performing of the manufacturing process may include performing front size process.

The performing of the manufacturing process may include performing a backside process.

The aggregate size of the multiple mesas may be less than ten percent of an area of the substrate.

The aggregate size of the multiple mesas may be less than one percent of an area of the substrate.

The substrate may exhibit a high thermal conductivity.

The substrate may exhibit a thermal conductivity that exceeds 250 Watt/(Kelvin*meter).

The substrate may exhibit a thermal conductivity that exceeds 1000 Watt/(Kelvin*Meter).

The substrate may be a monocrystalline substrate.

The substrate may be made of one or more materials that differ from silicon.

The method wherein each donor structure may include a sacrificial layer.

The method wherein each mesa may include at least a portion of an active semiconductor device.

The method may include generating the multiple donor structures.

There may be provided a structure that may include mesas that may be electrically coupled to a substrate, wherein the structure may be manufactured by (a) receiving multiple donor structures that comprise multiple mesas; (b) placing the multiple donor structures on a substrate that lacks a semiconductor layer that covers the entire substrate; and (c) performing a manufacturing process that may include coupling the multiple mesas to the substrate.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which.

DETAILED DESCRIPTION OF THE DRAWINGS

Any reference to a system should be applied, mutatis mutandis to a method that is executed by the system.

Any reference to method should be applied, mutatis mutandis to system that is configured to execute the method and/or to a unit manufactured by the method.

A wafer is a non-limiting example of a substrate or an object that includes a substrate.

There is provided a structure that includes semiconductor devices (such as but not limited to active semiconductor devices such as transistors) and a substrate that may exhibit a high thermal conductivity. There is also provided a method for manufacturing the apparatus. High thermal conductivity may include values of above 250 Watt/(Kelvin*meter)—especially above 1000 and even above 1500 Watt/(Kelvin*Meter).

The manufacturing process and the apparatus are cheap and may have any desired size.

Figure 6:
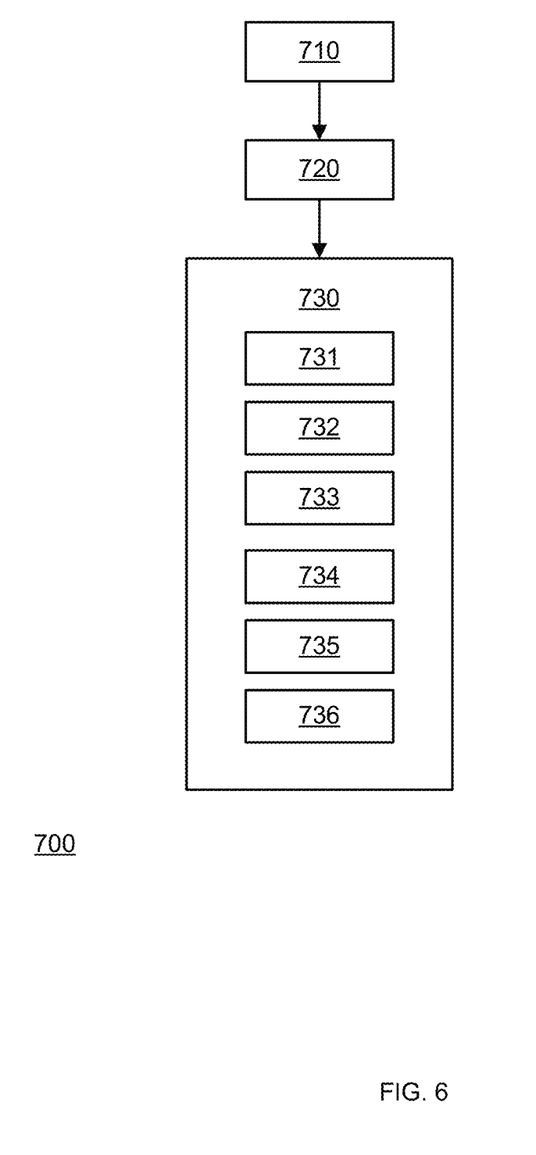
FIG. 6 illustrates an example of a method.

FIG. 6 illustrates method 700.

Method 700 may include:
a. Step 710 of generating, by applying a first manufacturing process, multiple donor structures that may be or may include elements such as but not limited to mesas.
b. Step 720 of placing the donor structures on a receiving wafer that has (or consists of) a substrate that exhibits a high thermal conductivity.
c. Step 730 of performing a second manufacturing process that includes electrically coupling the donor elements to (at least) the substrate that exhibits a high thermal conductivity.

It should be noted that step 710 may be replaced by receiving the multiple donor structures.

Step 730 may include at least one out:
a. Exposing semiconductor devices included in the donor structures. (731).
b. Using the donor elements as a part of semiconductor devices. (732)
c. Removing photo resist or any other masks elements of the donor structures. (733).
d. Electrically and/or mechanically coupling the semiconductor devices related to the donor elements to the substrate and/or to other semiconductor devices and/or other components of the apparatus. (734).

e. Performing front size processes. (735).

f. Performing backside processes such as thinning the substrate. (736).

Figure 1:
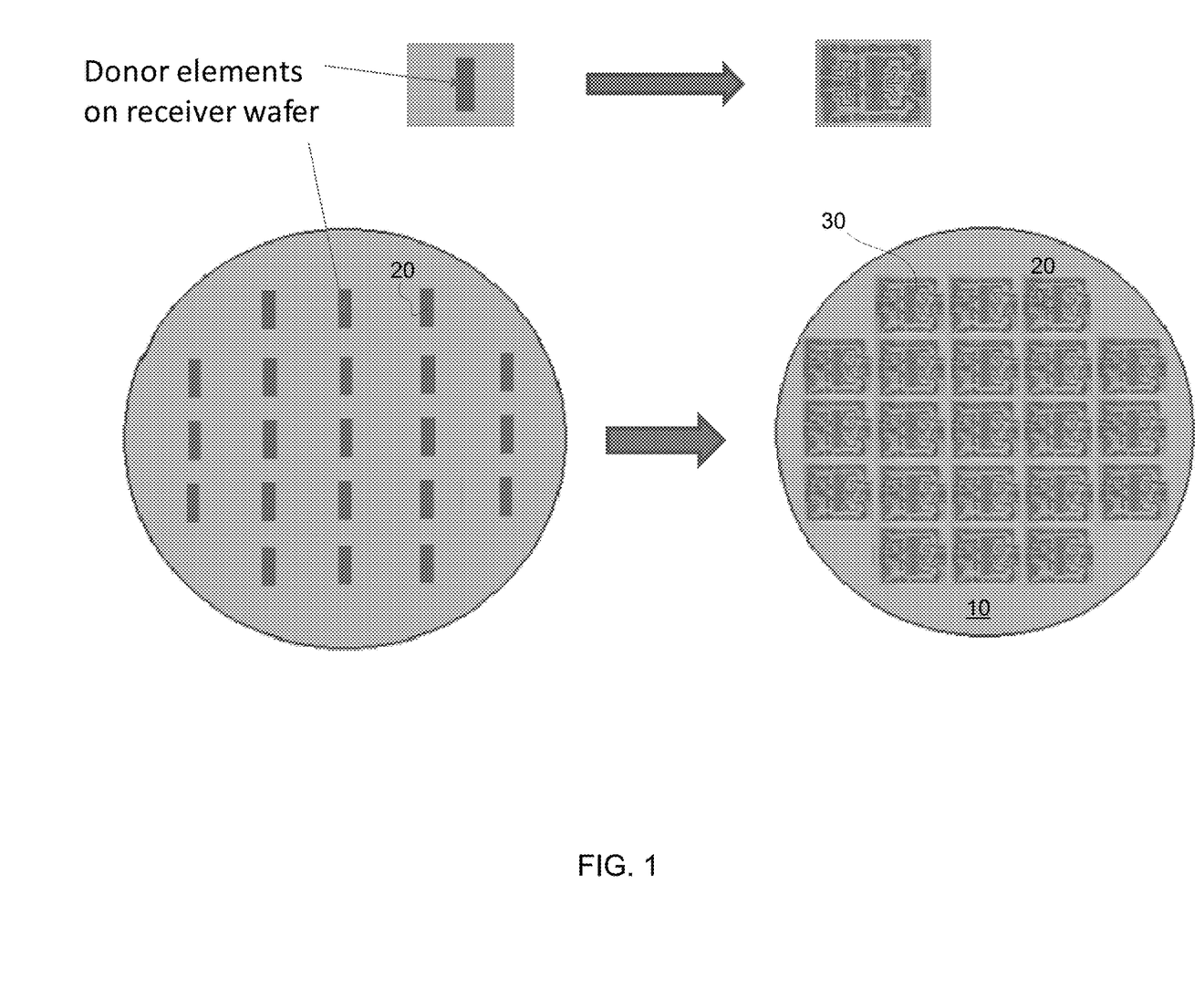
FIG. 1 illustrates an example of a receiver wafer.

The overall area of the donor elements may be a fraction (for example smaller than 1/X, wherein X may exceed two, three, four, ten, one hundred, and the like) of the area of the substrate. See—for example FIG. 1—substrate 10 is much larger than the aggregate size of all donor structures 20. FIG. 1 also illustrates a donor element as a part of a semiconductor circuit 30.

Usually most of the wafer is allocated for supporting passive elements.

The first manufacturing process may be executed independently from the second manufacturing process—by a different manufacturing tool, under different conditions, and the like.

By manufacturing the donor elements and them attaching them to the substrate—there is no need to manufacture one or more semiconductors layer that "cover" the entire substrate—and then remove, destroy, and/or cancel the semiconductor quality of most of the one or more semiconductor layers—thus providing a more efficient manufacturing process.

Step 710 of generating, by applying a first manufacturing process, the donor elements may include generating donor structures that are removable from a substrate. This may be achieved by receiving or manufacturing a sacrificial layer and a substrate (such as but not limited to a silicon substrate), and then manufacturing donor structures on the sacrificial layer.

The sacrificial layer may be removed during (or before) the removal of the donor structures.

The donor structures may include supporting elements (such as legs) that may provide a certain space between the donor structures and the substrate—after the sacrificial layer is removed.

The donor elements may be extracted from the donor structures at a later stage. Alternatively—the donor elements may be the donor structures.

Figure 2:
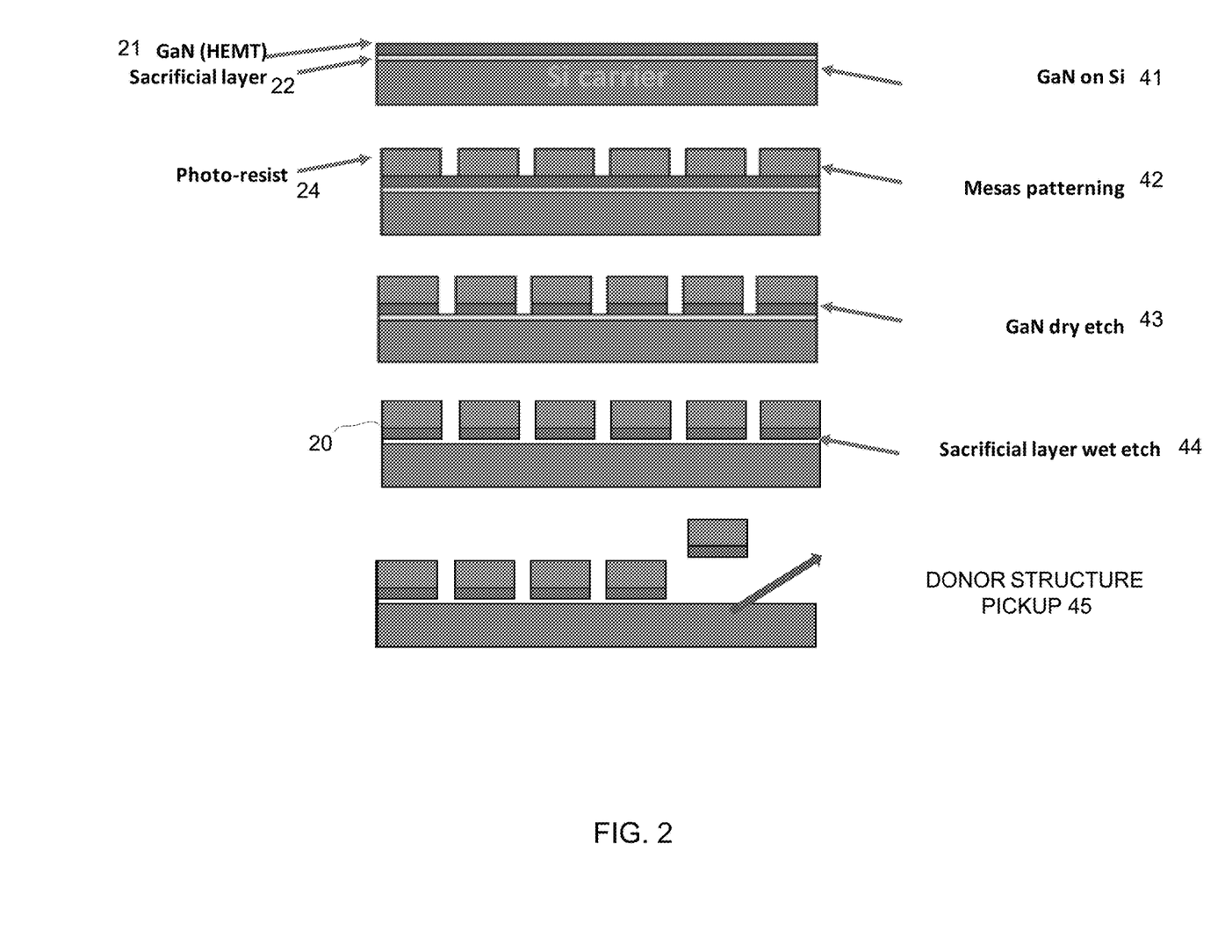
FIG. 2 illustrates an example of a process for manufacturing donor elements.

The donor structures may be manufactured by any process—for example (referring to FIG. 2) depositing a layer of GaN layer 41, forming a photoresist mask on the GaN layer 42, and forming a Gan layer pattern (by dry etch 43 followed by sacrificial layer removal by wet etch 44) of multiple separate donor structures. The Gan layer is denoted 21, the sacrificial layer is denoted 22, the Si carrier is denoted 23 and the photoresists is denoted 24.

Figure 3:
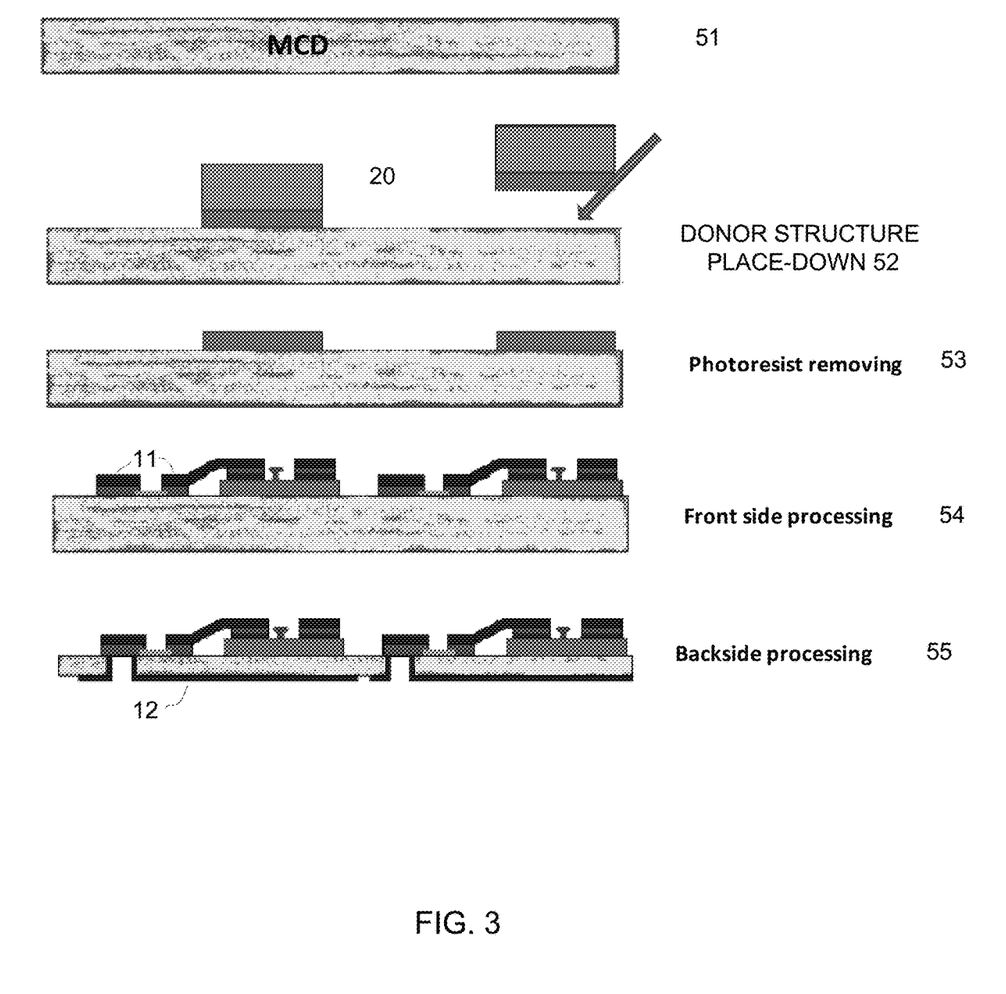
FIG. 3 illustrates an example of a process for manufacturing a structure that includes the donor elements and a substrate that exhibits a high thermal conductivity.

FIG. 3 illustrates an example of the placing the donor elements on a receiving wafer that has (or consists of) a substrate that exhibits a high thermal conductivity, and of the second manufacturing process.

In FIG. 3 the placing includes positioning (52) the donor structures with the donor elements on a monocrystalline (MCD) substrate 10, and removing 53 the developed photoresist layer from the donor structures to expose the donor elements (such as mesas). This is followed by front side processing 54 (for example—adding front side processing structural elements 11) and by backside processing 55 (for example—etching, adding backside processing structural elements 12).

The MCD substrate is cheap and can be easily manufactured to any desired size (for example 4", 6", 8" diameter—and even more). It also exhibits a high thermal conductivity.

In FIG. 3, the second manufacturing process the donor elements are used as a base layer of a transistor. The second manufacturing process includes (a) a front size processing 54—than may include manufacturing additional components 11 such as transistors parts (gate, source, drain) and/or adding one or more metal layers (conductors), and (b) a backside processing 55—of thinning the substrate (and even adding backside processing structural elements 12).

Figure 4:
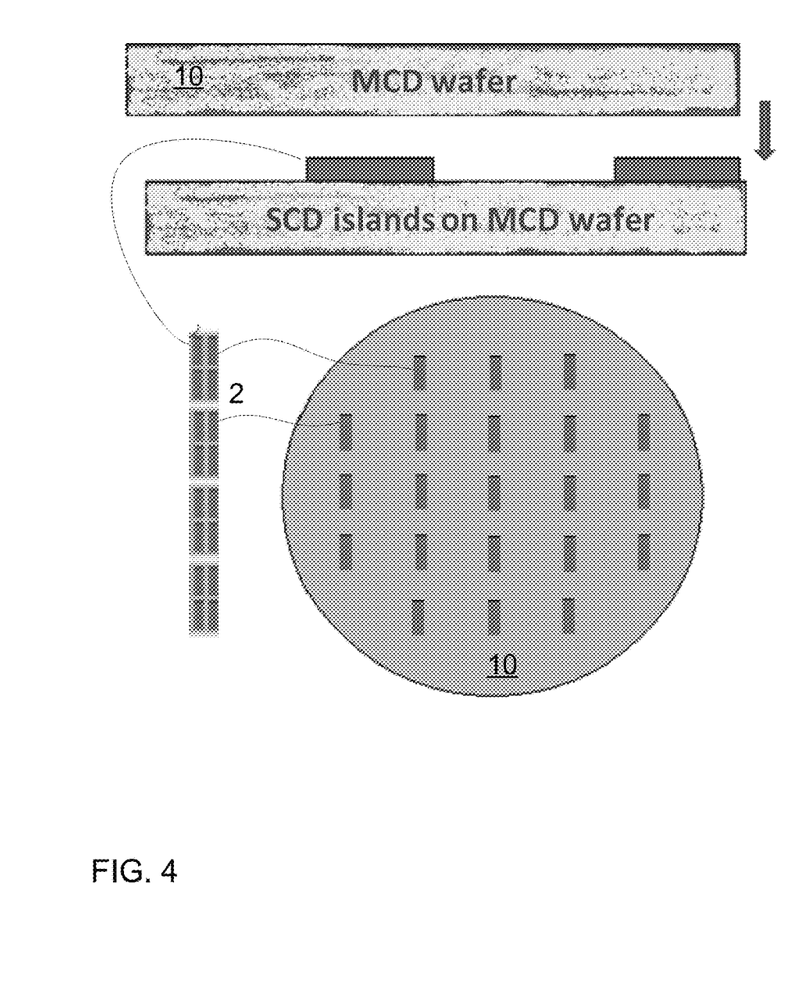
FIG. 4 illustrates an example of a donor elements on a MCD receiver wafer.

FIG. 4 illustrates an example of a MCD wafer 10 and SCD donor elements 20—and also illustrates an example of manufacturing the SCD donor elements.

The manufacturing the SCD donor elements may include:

a. Providing a single crystal diamond substrate 71.

b. Carbon ions implanting 72.

c. Etching (for example Ar/O2) etching for segmenting the upper layer of the carbon ion implanted crystal diamond substrate 73.

d. Separating the segments by graphite layer etching 74.

Figure 5:
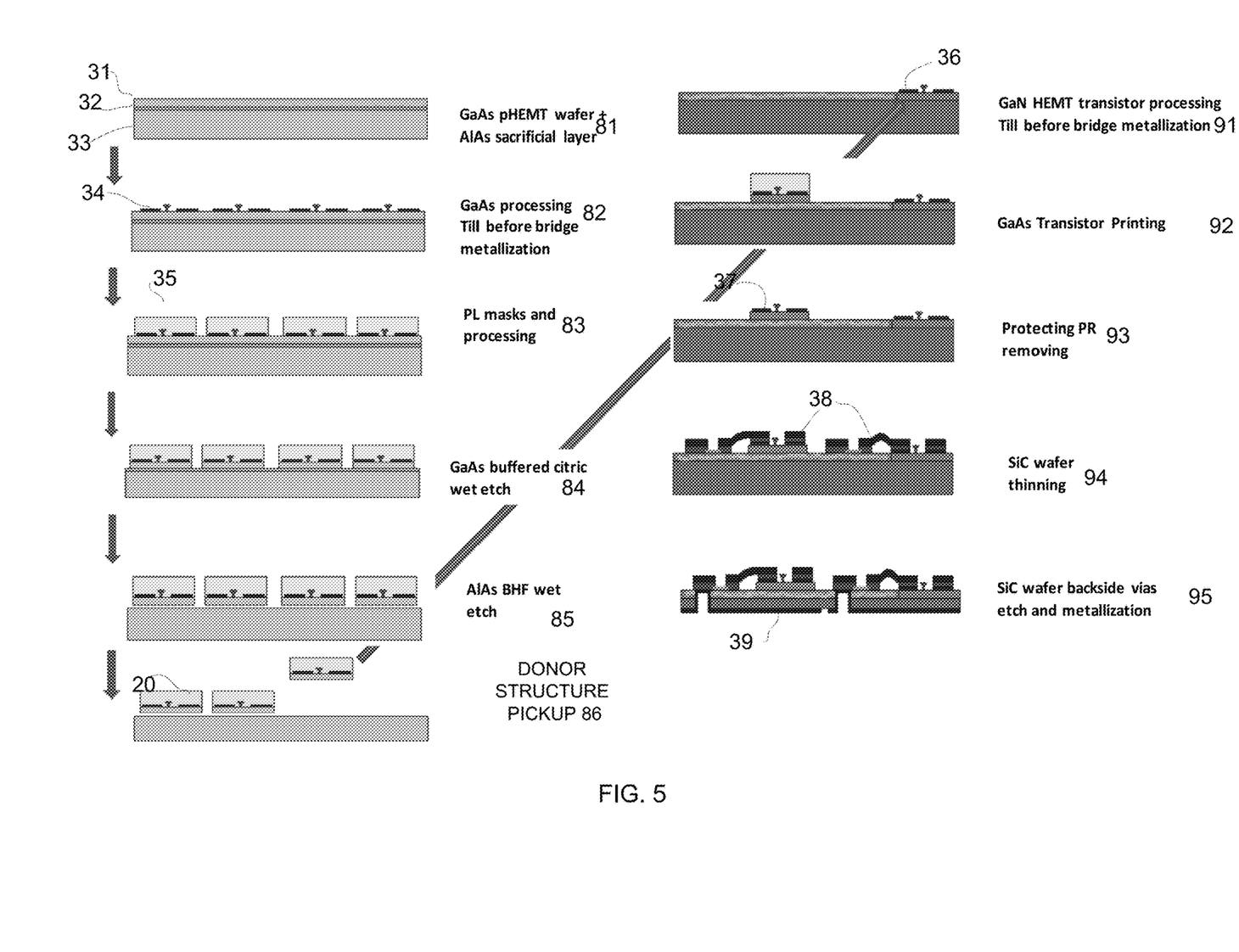
FIG. 5 illustrates an example of a structure that includes different types of transistors and a substrate that exhibits a high thermal conductivity.

The left part of FIG. 5 illustrates a first manufacturing process that may include:

a. Receiving or manufacturing 81 a substrate 33, a sacrificial layer 32 and P-type High-electron-mobility transistor (pHEMT) layers 31. The outcome of step 1 may be a GaAs pHEMT wafer that has a sacrificial layer.

b. Processing 82 the one or more pHEMT layers to provide GaAs transistors 34—without the metallization layers.

c. Masking 83 the GaAs transistors (and optionally performing more processes) to provide donor structures.

d. Etching 84 the unmasked pars of the one or more pHEMT layers to reach the sacrificial layer.

e. Removing 85 the sacrificial layer—and thus assisting in the future removal of the donor structures 20.

The right part of FIG. 5 illustrates the placing the donor elements on a receiving wafer that has (or consists of) a substrate that exhibits a high thermal conductivity and the performing a second manufacturing process. The right part includes the following stages:

a. Manufacturing or providing (i) a substrate that exhibits a high thermal conductivity, (ii) one or more Gan on Sic transistors (36), and an upper layer that includes implanted isolated Gan molecules. Step 91.

b. Positioning 92 the donor structures with the donor elements on the upper layer c. Removing 93 the masks from the donor structures to expose the upper side of the donor elements.

d. Front side processing 94 (such as Monolithic Microwave Integrated Circuit front side processing—adding elements 38).

e. Back side processing 95 (such as Monolithic Microwave Integrated Circuit back side processing—adding elements 39).

Any of the mentioned above materials may be replaced by an equivalent material.

The mentioned above process may be applied for manufacturing semiconductor devices and integrated circuits (IC) on diamond, SiC, AlN, Si and other high thermal conductive substrates by transfer printing.

Transfer printing involves the use of a soft elastomer with engineered features of relief on its surface for high speed, precision, nondestructive retrieval of spatially selected collections of micro- and nanostructured materials formed on a 'donor' substrate for the purpose of delivery and distribution into two-dimensionally organized arrays on a 'receiver' of virtually any type of substrate in a massively parallel, deterministic manner.

The 'donor' elements can be fabricated from single crystalline diamond, GaN/Si, SiC and epitaxially grown III-V compound semiconductors in schemes that involve selective wet chemical etching of underlying 'sacrificial' materials to release them from donor substrates. For the preparation of donor materials in printable forms, micro-fabricated structures serve to retain lithographically defined layouts after undercut release.

The manufacturing process may prevent overheating of high power active and passive components such as diodes, transistors and may be applicable to apparatuses such as integrated circuit, MEMS, solar cells, light-emitting diodes, lasers, photodetectors and integrated collections of these in functional systems The manufacturing process is based on using at least some out of:
  a. Donor structures that may be equipped by 'sacrificial' layer lying under donor elements layer and can be selective wet etched regarding the donor layer and substrate materials. The Donor elements may include anchors or other spacing elements.
  b. A receiver substrate that may be of any required size, thickness, may exhibit a bow/warp less than a desired value (for example 5 microns) and may or may not be polished to some degree (for example—polished to 0.5 nanometer surface roughness).
  c. Elastomeric P&P stamp. The stamp is designed to pick up the donor element from donor structure and place down it on receiver substrate While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

Any reference to any of the terms "comprise", "comprises", "comprising" "including", "may include" and "includes" may be applied to any of the terms "consists", "consisting", "consisting essentially of".

Any reference to the phrase "may be" should also be interpreted as "may not be".

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "rear" "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between various components are merely illustrative and that alternative embodiments may merge various components or impose an alternate decomposition of functionality upon various components. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" Each other such that the desired functionality is achieved, irrespective of architectures or intermedial components. Likewise, any two components so associated can also be viewed as being "operably connected," or "operably coupled," to Each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

We claim:

1. A method for generating a structure, the method comprises:
   receiving multiple donor structures that comprise multiple mesas; wherein each mesa comprises at least a portion of an active semiconductor device;
   placing the multiple donor structures on a substrate that lacks a semiconductor layer that covers the entire substrate; and
   performing a manufacturing process that comprises coupling the multiple mesas to the substrate.

2. The method according to claim 1 wherein the performing of the manufacturing process comprises forming a photoresist layer above the multiple mesas; and removing the photoresist layer thereby exposing the multiple mesas.

3. The method according to claim 1 wherein the performing of the manufacturing process comprises forming masking elements above the multiple donor structures and removing the masking elements from the multiple donor structures.

4. The method according to claim 1 wherein the performing of the manufacturing process comprises forming structural elements and electrically coupling the multiple mesas to structural elements.

5. The method according to claim 1 wherein the performing of the manufacturing process comprises electrically coupling at least some of the multiple mesas to each other.

6. The method according to claim 1 wherein the performing of the manufacturing process comprises performing front size process that comprises adding front side processing structural elements.

7. The method according to claim 1 wherein the performing of the manufacturing process comprises performing a backside process that comprises adding backside processing structural elements.

8. The method according to claim 1 wherein an aggregate size of the multiple mesas is less than ten percent of an area of the substrate.

9. The method according to claim 1 wherein an aggregate size of the multiple mesas is less than one percent of an area of the substrate.

10. The method according to claim 1 wherein the substrate exhibits a thermal conductivity that exceeds 250 Watt/(Kelvin*meter).

11. The method according to claim 1 wherein the substrate exhibits a thermal conductivity that exceeds 1000 Watt/(Kelvin*Meter).

12. The method according to claim 1 wherein the substrate is a monocrystalline substrate.

13. The method according to claim 1 wherein the substrate is made of one or more materials that differ from silicon.

14. The method according to claim 1 comprises generating the multiple donor structures.

15. A method for generating a structure, the method comprises: receiving multiple donor structures that comprise multiple mesas; placing the multiple donor structures on a substrate that lacks a semiconductor layer that covers the entire substrate; and performing a manufacturing process that comprises coupling the multiple mesas to the substrate; wherein each donor structure comprises a sacrificial layer.

16. A structure that comprises mesas that are electrically coupled to a substrate, wherein the structure is manufactured by (a) receiving multiple donor structures that comprise multiple mesas; wherein each mesa comprises at least a portion of an active semiconductor device; (b) placing the multiple donor structures on a substrate that lacks a semiconductor layer that covers the entire substrate; and (c) performing a manufacturing process that comprises coupling the multiple mesas to the substrate.

* * * * *